United States Patent [19]
Pietschmann
[11] 3,769,527
[45] Oct. 30, 1973

[54] CIRCUIT ARRANGEMENT FOR IMPROVING THE SHORT CIRCUIT RESISTANCE OF AN LSL CIRCUIT BY AUTOMATICALLY LIMITING CIRCUIT POWER CONSUMPTION

[75] Inventor: Erhard Pietschmann, Eglharting, Germany
[73] Assignee: Siemens Aktiengesellschaft, Berlin & Munich, Germany

[22] Filed: Aug. 10, 1972
[21] Appl. No.: 279,503

[30] Foreign Application Priority Data
Aug. 27, 1971 Germany.................. P 21 43 031.9

[52] U.S. Cl..................... 307/270, 307/297, 330/32
[51] Int. Cl..........................H03k 1/00, H03k 3/26
[58] Field of Search.................... 307/270, 296, 297; 330/32

[56] References Cited
UNITED STATES PATENTS

| | | | |
|---|---|---|---|
| 3,185,934 | 5/1965 | Patmore et al. | 330/32 X |
| 3,496,385 | 2/1970 | Hopkins | 307/297 X |

FOREIGN PATENTS OR APPLICATIONS

| | | | |
|---|---|---|---|
| 1,901,887 | 8/1970 | Germany | 307/297 |
| 1,762,963 | 12/1970 | Germany | 307/297 |

*Primary Examiner*—John S. Heyman
*Assistant Examiner*—Andrew J. James
*Attorney*—Benjamin H. Sherman et al.

[57] ABSTRACT

An output switch amplifier in a gate circuit has improved short circuit resistance and employs two transistors, the emitter-collector paths of which are connected in series via an emitter resistor of one of the transistors of at least 250 ohm and by way of a diode. The connection point of the resistor with the diode provides an output terminal. The transistors are controlled for conduction or blockage depending on the switching state. If the transistor with the emitter resistor is conductive, the diode will be blocked. In the case of short circuit at the output, the short circuit current at the emitter resistor will produce a voltage which exceeds the Zener break down voltage of the diode. The diode becomes conductive and limits the voltage drop at the emitter resistor since it is connected with the base of the conducting transistor. The possible power consumption in the transistor is therefore limited to a value which is not harmful.

1 Claim, 1 Drawing Figure

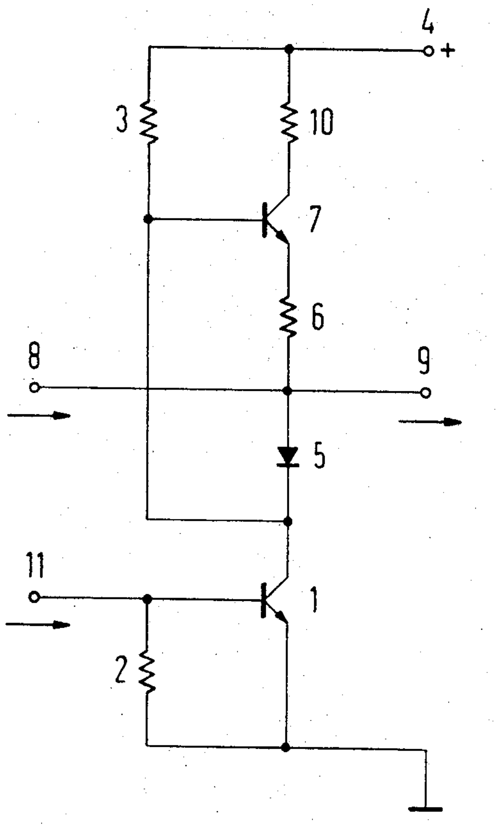
4
+
3
10
7
6
8
9
5
11
1
2

CIRCUIT ARRANGEMENT FOR IMPROVING THE SHORT CIRCUIT RESISTANCE OF AN LSL CIRCUIT BY AUTOMATICALLY LIMITING CIRCUIT POWER CONSUMPTION

BACKGROUND OF THE INVENTION

1. Field of the Invention

This invention relates to a circuit arrangement for improving the short circuit resistance of a slow speed logic circuit whose output includes a switch amplifier.

2. Description of the Prior Art

Circuits of the above general type are known in which two transistors which are conductive or blocked, depending on the control of the output switch amplifier, but which are operated differently from each other. The transistors either connect the amplifier output in a low resistance path with a reference potential, and therefore with one of the poles of an operational voltage source, depending on the switching state, or with the other pole of the operational voltage source, for which reason the amplifier output is connected with the collector of a first transistor via a diode, and with the emitter of a second transistor of the same type, via an ohmic resistor. The collector of the second transistor is connected to the other pole of the operational voltage source by way of a resistor and the base of the second transistor and the collector of the first transistor are connected by way of a common resistor. The emitter of the first transistor is directly connected to the reference potential and the base of the first transistor is connected by way of a resistor, whereby the base of the first transistor and the emitter of the second transistor are connected to the input for receiving a control signal.

Such a circuit arrangement is known, for example, through disclosure in the German Offenlegungsschrift Nos. 1,901,887 and 1,762,963. The gate circuit illustrated in the German Offenlegungsschrift No. 1,901,887 is of the type known as a slow, interference-free logic (LSL) circuit and contains an output switch amplifier. The present invention has this circuit arrangement as its starting point. The function and dimensioning rules of such an output amplifier are described in detail in the German Offenlegungsschrift No. 1,762,963. Depending on the control voltage applied to the base of the above-mentioned first transistor and the emitter of the above-mentioned second transistor, one of the transistors will be blocked and the other one conductive, or vice versa. The resistance applied to the emitter of the second transistor is provided as a measure for suppressing interference oscillations at the output. The dimensioning of this resistor thereby depends on the dimensioning of the entire output switch amplifier and on the capacitive component of the load at the output. The resistance value therefore does not exceed 150 ohm, as set forth on Page 4 of German Offenlegungsschrift No. 1,762,963.

This resistance, connected to the emitter of the second transistor and that connected to the collector of the second transistor will jointly cooperate to protect the second transistor in the case that it is in the conductive state and a short circuit occurs at the output. The above-mentioned limit for the maximum value of resistance, and an upper limit for both together is given since the static internal resistance of the output switch amplifier is to be as small as possible. The short circuit resistance of the output switch amplifier is therefore relatively limited.

SUMMARY OF THE INVENTION

The primary object of the present invention is to increase the short circuit resistance of the output switch amplifier, and thus the short circuit resistance of the logic circuit.

According to the invention, the foregoing object is achieved through the provision of a resistance between the amplifier output and the emitter of the second transistor of at least 250 ohm in a circuit arrangement of the type generally discussed above.

BRIEF DESCRIPTION OF THE DRAWING

Other objects, features and advantages of the invention, its organization, construction and operation will be best understood from the following detailed description of a preferred embodiment thereof taken in conjunction with the single drawing, on which is a single FIGURE illustrating in schematic form a switch amplifier for use in slow interference free logic circuits.

DESCRIPTION OF THE PREFERRED EMBODIMENT

In accordance with the principles of the invention the drawing illustrates a sample embodiment of how the short circuit resistance is to be increased. The emitter of a transistor 1 of the npn type is connected to a reference potential. The base of the transistor 1 is connected with the reference potential by way of a resistor 2. The collector of the transistor 1 is connected to the positive pole 4 of an operational voltage source by way of a resistor 3. In addition, the base of the transistor 1 is connected to a terminal 11 which serves as an input and the collector is connected with the emitter of a transistor 7 of the npn type by way of a series connection of a diode 5 and a resistor 6. The connection point of the diode 5 with the resistor 6 serves as an output, as indicated by the terminal 9. The base of the transistor 7 is connected with the pole 4 of the operational voltage source by way of the resistor 3 and the collector of the transistor 7 is connected with the pole 4 of the operational voltage source by way of a resistor 10. The diode 5 is poled in such a way that a continuous conduction path exists in the conduction state by way of the diode 5 along with the emitter-collector paths of the transistors 7 and 1. The resistor 6 has a value of at least 250 ohms.

If the transistor 1 is placed in a nonconductive state due to the application of control potentials at the terminals 11 and 8 of the input, and the transistor 7 is conductive, the output current will flow by way of the resistors 6 and 10 and the emitter-collector path of the transistor 7. If not, and a short circuit occurs at the output terminal 9, and the short circuit current flowing through the resistor 6 will produce a voltage drop at the diode 5 such that the potential thereacross, due to its connection to the base of the transistor 7 and the resistor 3, exceeds the Zener break down voltage, and the diode 5 becomes conductive in the direction opposite to its normal direction of conduction. Therefore, the voltage drop at the resistor 6 cannot increase further. The constant voltage operation which prevails at the output terminal 9 up to this point will change into a constant current operation. The transistor 7 will therefore transfer from the saturated state into the unsaturated state, and the entire resistance will therefore be increased in such a way that the power, in the case of a short circuit, is limited to a value which can be determined by the dimensioning of the resistors 6 and 10. Since the power consumption which occurs in the transistor 7 can thus be limited, sufficient protection is guaranteed for the transistor 7.

Although I have described my invention by reference to a specific illustrative embodiment thereof, many changes and modifications of my invention may become apparent to those skilled in the art without departing from the spirit and scope thereof. I therefore intend to include within the patent warranted hereon all such changes and modifications as may reasonably and properly be included within the scope of my contribution to the art.

I claim:

1. A circuit arrangement for improving the short circuit resistance of slow interference-free logic circuits, comprising an output amplifier which includes first and second transistors each having a base, an emitter and a collector, an input, an output, a diode connected between said output and said collector of said first transistor, a first resistor having a value of at least 250 ohms connected between said diode and said emitter of said second transistor, said diode also being connected to said base of said second transistor, a second resistor, said base of said second transistor and said collector of said first transistor connected to an electrical supply potential via said second resistor, said emitter of said first transistor connected to a reference potential, a third resistor, said base of said first transistor connected to the reference potential via said third resistor, and a fourth resistor connected between said collector of said second transistor and the electrical supply potential, said emitter of said second transistor and the base of said first transistor connected to said input to receive control signals for rendering said first and second transistors alternately conductive, said diode rendered conductive in the direction opposite to its poling in said arrangement in response to a short circuit at said output to limit the power consumption of the combination of said second transistor, said first resistor and said fourth resistor.

* * * * *